United States Patent
Xu et al.

(10) Patent No.: US 11,973,289 B2
(45) Date of Patent: Apr. 30, 2024

(54) ELECTRICAL CONNECTOR AND DEVICE FOR TESTING CONDUCTION

(71) Applicant: SUZHOU HYC TECHNOLOGY CO., LTD., Jiangsu (CN)

(72) Inventors: Jianye Xu, Suzhou (CN); Bin Jiang, Suzhou (CN)

(73) Assignee: SUZHOU HYC TECHNOLOGY CO., LTD., Suzhou (CN)

(*) Notice: Subject to any disclaimer, the term of this patent is extended or adjusted under 35 U.S.C. 154(b) by 254 days.

(21) Appl. No.: 17/636,347

(22) PCT Filed: Aug. 14, 2020

(86) PCT No.: PCT/CN2020/109050
§ 371 (c)(1),
(2) Date: Feb. 17, 2022

(87) PCT Pub. No.: WO2021/196497
PCT Pub. Date: Oct. 7, 2021

(65) Prior Publication Data
US 2022/0278472 A1   Sep. 1, 2022

(30) Foreign Application Priority Data
Mar. 30, 2020 (CN) .......................... 202020434409.5

(51) Int. Cl.
*H01R 13/24* (2006.01)
*G01R 1/04* (2006.01)
(Continued)

(52) U.S. Cl.
CPC ....... *H01R 13/2464* (2013.01); *G01R 1/0416* (2013.01); *H01R 13/2428* (2013.01);
(Continued)

(58) Field of Classification Search
CPC ............ H01R 13/2464; H01R 13/2428; H01R 13/40; H01R 13/629; H01R 43/24;
(Continued)

(56) References Cited

U.S. PATENT DOCUMENTS 5,865,641 A * 2/1999 Swart ................... H01R 12/721
439/482
9,831,589 B2  11/2017 Chui
(Continued)

FOREIGN PATENT DOCUMENTS

| CN | 101061609 A | 10/2007 |
|----|-------------|---------|
| CN | 206515372 U | 9/2017  |

(Continued)

OTHER PUBLICATIONS

The international search report dated Dec. 29, 2020 in PCT Application No. PCT/CN2020/109050.

*Primary Examiner* — Travis S Chambers
(74) *Attorney, Agent, or Firm* — Kilpatrick Townsend & Stockton LLP

(57) ABSTRACT

The present disclosure provides an electrical connector and a device for testing conduction which relate to the field of testing devices. By providing a first contact end having a planar structure, the contact area between the electrical connector and a testing substrate is increased, and a large current can be conducted and damage to the product and device is avoided. A second contact end is a point or linear structure, and when poor contact is caused due to the uneven testing substrate or oxidization of the testing substrate, effective contact and electrical connection with the testing substrate can be achieved, to improve the effectiveness of an electrical connection.

9 Claims, 4 Drawing Sheets

(51) Int. Cl.
    *H01R 13/40*       (2006.01)
    *H01R 13/629*    (2006.01)

(52) U.S. Cl.
    CPC ........... *H01R 13/40* (2013.01); *H01R 13/629* (2013.01); *H01R 2201/20* (2013.01)

(58) Field of Classification Search
    CPC .............. H01R 2201/20; H01R 12/716; H01R 13/193; H01R 13/02; G01R 1/0416; G01R 31/54; G01R 1/04
    See application file for complete search history.

(56) References Cited

U.S. PATENT DOCUMENTS

2010/0244875 A1*   9/2010   Chabineau-Lovgren .................... H01R 12/714
                                                                                                  324/755.11
2016/0104956 A1*   4/2016   Santos ............... H01R 13/2414
                                                                                                     439/86

FOREIGN PATENT DOCUMENTS

| CN | 208367045 U | 1/2019 |
|---|---|---|
| CN | 208508029 U | 2/2019 |

* cited by examiner

ELECTRICAL CONNECTOR AND DEVICE FOR TESTING CONDUCTION

FIELD OF THE DISCLOSURE

The present disclosure relates to the field of testing devices, particularly to an electrical connector and a device for testing conduction.

BACKGROUND OF THE DISCLOSURE

With the development of science and technologies, electronic products are updated continuously. Accordingly, the manufacturing process becomes increasingly complex, the structural design tends to be more sophisticated, and the functions become more comprehensive. In view of this, it is crucial to ensure the performance and quality of electronic products in the production process of the electronic products.

In the prior art, various performance parameters of electronic products need to be tested before the electronic products leave the factory. Generally, the product to be tested is connected to a testing apparatus via an electrical connector and the testing apparatus outputs a signal to be tested and receives feedback information from the product to be tested, to determine whether the product to be tested has any defects. The current electrical connector is a separated structure including two contact ends and an elastic member in the middle. During the test, the elastic member is compressed for conduction detection. After long-time operation, on one hand, the contact ends might be damaged and on the other hand, the elastic member tends to deform. In addition, the separated structure is inconvenient in assembly and has relatively high costs.

Moreover, the current electrical connector has a relatively small area with which the product contacts, resulting in poor stability, being unable to conduct a relatively large current and tendency to scratch the product.

In view of the above problems, it is necessary to provide a novel electrical connection device to ensure effective contact with the product, improve the stability and accuracy of the test and avoid the product damage.

SUMMARY OF THE DISCLOSURE

The embodiments of the present disclosure is to provide an electrical connector and a device for testing conduction, to ensure effective contact with a product, improve the stability and accuracy of a test and avoid product damage.

Embodiments of the present disclosure provides an electrical connector which includes a connection body, a first connection portion at one end of the connection body and a second connection portion at the other end of the connection body. The first connection portion, the connection body and the second connection portion are molded integrally. The second connection portion is connected to a testing substrate and includes a first contact end and a second contact end. The first contact end is a planar structure and the second contact end is a point or linear structure. During an electrical connection, both the first contact end and the second contact end are conducted with the testing substrate.

In one embodiment, the second contact end is a toothed structure and the top of the toothed structure is in contact and conducted with the testing substrate.

In one embodiment, the first connection portion is connected to a product to be tested. An end of the first connection portion facing the product to be tested is provided with a groove structure and a connection end of the product to be tested is accommodated in the groove structure. The groove structure extends toward the product to be tested to form a guide structure, and when the electrical connection is enabled, the connection end of the product to be tested moves from the guide structure to one side of the groove structure and slides into the groove structure.

In one embodiment, the groove structure is arc-shaped. The inner wall of the groove structure is in contact with the connection end, and a connection between the groove structure and the guide structure presents a smooth transition.

In one embodiment, when the electrical connection is enabled, the size of the groove bottom of the groove structure is less than the size of the connection end and the connection end is tangent to the inner wall of the groove structure to form two contact lines.

In one embodiment, the connection body includes an elastic portion, a first extension portion extending upward from the elastic portion and connected to the first connection portion and a second extension portion extending downward from the elastic portion and connected to the second connection portion. The width of each of the first extension portion and the second extension portion is greater than the width of the elastic portion.

In one embodiment, the elastic portion is an S-shaped structure formed by at least one U-shaped member or C-shaped member in form of end-to-end connection. Under the action of an external force, an open end of the U-shaped member or C-shaped member contracts.

In one embodiment, the elastic portion is a solid or hollow structure, and when the elastic portion is a hollow structure, hollow holes extend or are arranged in sections along the extension direction of the elastic portion.

In one embodiment, the first contact end, the second contact end, and the second extension portion are connected to form an inverted U-shaped structure.

The present disclosure further discloses a device for testing conduction which includes a core assembly and the electrical connector, and the core assembly is provided with a placement groove for accommodating the electrical connector and the placement groove matches the shape of the electrical connector. Electrical connectors are sequentially distributed and fixed in the corresponding placement grooves respectively.

Compared with the prior art, the electrical connector and the device for testing conduction provided by the present disclosure have the following embodiments:

By providing the first contact end having a planar structure, the contact area between the electrical connector and the testing substrate is increased, and a large current can be conducted and damage to the product and device is avoided. The second contact end is a point or linear structure, and when poor contact is caused due to the uneven testing substrate or oxidization of the testing substrate, the top of the toothed structure can break an oxidization layer to contact the surface of the testing substrate, ensuring effective contact and electrical connection between at least one tooth and the testing substrate, to improve the effectiveness of the electrical connection.

By providing, at the end of the electrical connector which is in contact with the product to be tested, the groove structure, during the electrical connection, the connection end of the product to be tested is accommodated in the groove structure, resulting in increasing the contact area and achieving a stable and effective connection between the product to be tested and the electrical connector. During the connection, the product to be tested is placed inside the groove structure and then clamped above the bottom of the groove structure. The product is tangent to the groove structure at left and right groove walls to form two contact lines. The design can ensure that, during the test, the contact positions between products to be tested and the electrical connector are consistent, to ensure the accuracy of the testing structure and improving the test precision.

Moreover, the groove structure extends toward the product to be tested to form the guide structure. When the electrical connection is enabled, the connection end of the product to be tested moves from the guide structure to one side of the groove structure and slides into the groove structure. In the case of a deviation in positioning the product to be tested, the connection end of the product to be tested can be effectively aligned, to ensure the stability and accuracy of the connection and improving the test precision.

BRIEF DESCRIPTION OF THE DRAWINGS

The specific embodiments of the present disclosure are described in further details below with reference to the drawings.

Figure 1:
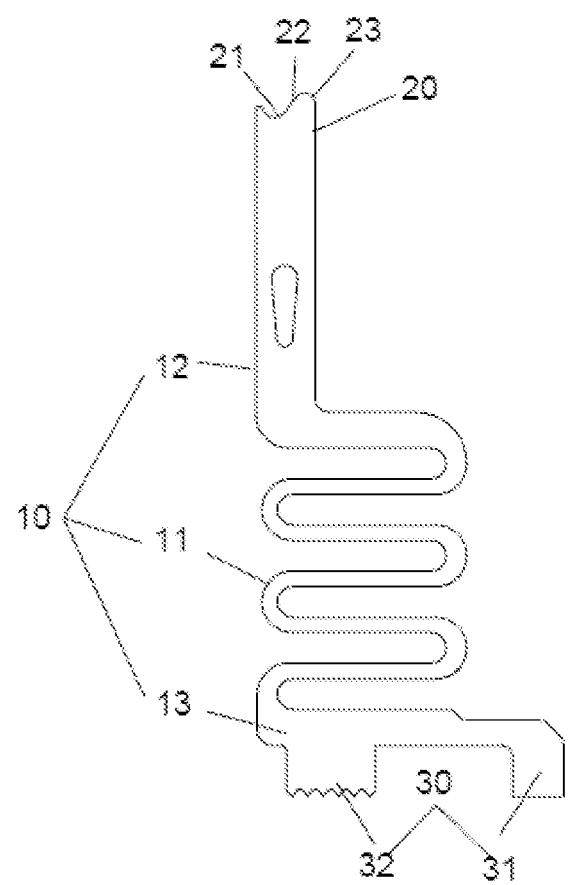
FIG. 1 is a schematic diagram of the structure of an electrical connector provided in embodiment 1 of the present disclosure.

The names of corresponding components represented by numbers or letters in the figures are as follows:

1. Electrical connector; 2. Core assembly; 3. Product to be tested;
10. Connection body; 20. First connection portion; 30. Second connection portion;
11. Elastic portion; 12. First extension portion; 13. Second extension portion;
131. Reinforcement portion; 21. Groove structure; 22. Guide structure; 23. Chamfer
31. First contact end 32. Second contact end
201. Placement groove 202. Spacer

DETAILED DESCRIPTION OF THE DISCLOSURE

Various exemplary embodiments of the present disclosure are described in detail below with reference to the drawings. It should be noted that, unless otherwise specifically stated, the relative arrangement of components and steps, numerical expressions and numerical values set forth in these embodiments do not limit the scope of the present disclosure.

The following description of at least one exemplary embodiment is actually illustrative only and in no way serves as any limitation to the present disclosure and application or use thereof.

Some technology and apparatus may not be discussed in detail, but when appropriate, the technology and apparatus should be regarded as part of the description.

In all examples shown and discussed herein, any specific values should be interpreted as examples only rather than limitations. Therefore, other examples of the exemplary embodiment may have different values.

It should be noted that similar reference numerals and letters indicate similar components in the following drawings, and therefore, once a component is defined in one drawing, it does not need to be further discussed in the subsequent drawings.

In view of the defects of the prior art, the present disclosure provides an electrical connector to ensure effective contact with a product, improve the stability and accuracy of a test and avoid product damage.

As shown in FIG. 1, an electrical connector includes a connection body 10, a first connection portion 20 at one end of the connection body 10 and a second connection portion 30 at the other end of the connection body 10. The first connection portion 20, the connection body 10, and the second connection portion 30 are molded integrally. By integrally molding the electrical connector, the structure and assembly process are simplified, and the structural strength of the electrical connector is improved, to ensure the connection effectiveness and increasing the service life of the electrical connector.

Further, the electrical connector is a flat sheet structure.

The second connection portion 30 is connected to a testing substrate (not shown). The second connection portion 30 includes a first contact end 31 and a second contact end 32. The first contact end 31 is a planar structure and the second contact end is a point or linear structure. By providing the first contact end having a planar structure, the contact area between the electrical connector and the testing substrate is increased, a large current thus can be conducted and damage to the product and device is avoided.

The second contact end is a toothed structure and the top of the toothed structure is in contact and electrical connection with the testing substrate. The second contact end includes one or more teeth, and when poor contact is caused due to the uneven testing substrate or oxidization of the testing substrate, the top of the toothed structure can break an oxidization layer to contact the surface of the testing substrate, ensuring effective contact and electrical connection between at least one tooth and the testing substrate and improving the effectiveness of the electrical connection. In addition, the first contact end 31 and the second contact end 32 have the same height or the top of the second contact end is higher than that of the first contact end, ensuring that the second contact end can effectively contact the testing substrate.

An end of the first connection portion 20 facing the product to be tested is provided with a groove structure 21 and a connection end of the product to be tested is accommodated in the groove structure. By providing the groove structure for accommodating the connection end of the product to be tested, the contact area between the product to be tested and the electrical connector is increased, and the electrical connector can be positioned in a direction perpendicular to the connection direction to ensure stable contact between the product to be tested and the electrical connector.

In one embodiment, the groove structure is arc-shaped and a portion of the groove structure in contact with the product to be tested is a smooth arc-shaped structure to reduce contact damage to the product to be tested.

Further, the connection end of the product to be tested is tangent to the inner wall of the groove structure to form two contact lines. In the design, the size of the groove structure gradually decreases from the opening to the bottom and the bottom radian of the groove structure is less than the profile radian of the product to be tested. During the connection, the product to be tested is placed inside the groove structure and then clamped above the bottom of the groove structure, and is tangent to the groove structure at left and right groove walls to form two contact lines. The design can ensure that, during the test, the contact positions between products to be tested and the electrical connector are consistent, to ensure the accuracy and consistency of the testing structure.

For surface contact, contact surfaces may not fully fit. Due to problems such as manufacturing accuracy errors, different products to be tested might be in contact and electrical connection with the electrical connector at different positions, leading to different contact points and contact areas, so the accuracy of the test cannot be ensured. The solution of the present disclosure provides a contact form more stable than the surface contact form.

In addition, in other embodiments, the first connection portion may also be a flat structure, a smooth curved structure, a polygonal structure, etc. The polygonal structure may includes any one of a V-shaped structure, a U-shaped structure, a W-shaped structure, an L-shaped structure, a Y-shaped structure, a toothed structure, an inverted V-shaped structure, an O-shaped structure, an inverted U-shaped structure, a C-shaped structure and a T-shaped structure, or any variants thereof, which is not specifically limited herein.

Further, the groove structure extends toward the product to be tested to form a guide structure 22. When the electrical connection is enabled, the connection end of the product to be tested moves from the guide structure to one side of the groove structure and slides into the groove structure. In the case of a deviation in positioning the product to be tested, the connection end of the product to be tested can be effectively aligned, ensuring that all the products to be tested are in contact with the first connection portion at the same position, to ensure the stability and accuracy of the connection and improving the testing precision.

A connection between the groove structure 21 and the guide structure 22 presents a smooth transition. In one embodiment, the guide structure may be an inclined surface or a curved surface.

Further, the guide structure is configured to be higher than the groove structure. The guide structure can be formed on one or two sides of the groove structure. The connection end of the product to be tested is in contact with the guide structure prior to being put in place and then guided downward into the groove structure.

In order to avoid damage to the product, the top of the first connection portion is chamfered.

The connection body 10 includes an elastic portion 11, a first extension portion 12 extending upward from the elastic portion 11 and connected to the first connection portion 20 and a second extension portion 13 extending downward from the elastic portion 11 and connected to the second connection portion 30. The width of each of the first extension portion 12 and the second extension portion 13 is greater than the width of the elastic portion 11. By reducing the width of the elastic portion, the elasticity of the electrical connector is effectively ensured.

By increasing the widths of the first extension portion and the second extension portion, the overall structural strength of the electrical connector can be effectively ensured.

The elastic portion 11 is formed by at least one U-shaped member or C-shaped member in form of end-to-end connection. Under the action of an external force, an open end of the U-shaped member or C-shaped member contracts. In one embodiment, there are 4 U-shaped members or C-shaped members. The elastic portion of an S-shaped structure is formed by connecting the U-shaped members or C-shaped members in form of end-to-end connection. In the extension direction, the width of the elastic portion remains the same. In other embodiments, the width of the elastic portion may also change regularly, for example, the width may gradually increase and/or gradually decrease, or intermittently increase or decrease, which is not specifically limited herein. The specific size is not limited.

In addition, in order to ensure the overall continuity of the electrical connector, the size between the first extension portion and the elastic portion and the size between the second extension portion and the elastic portion gradually decrease.

The working principle of the present disclosure is as follows:

When a product is tested, the connection end of the product to be tested is placed in the groove structure 21 of the first connection portion 20, and the two connection ends of the second connection portion 30 are respectively in contact with the testing substrate. Under the action of an external force, the elastic portion 11 contracts and the overall height of the electrical connector 1 becomes smaller. Under the reaction force of the elastic portion 11, the tight connection of the electrical connector 1 and the product to be tested 3 to the testing substrate can be achieved, to ensure the stability of the connection.

Embodiment 2

Figure 2:
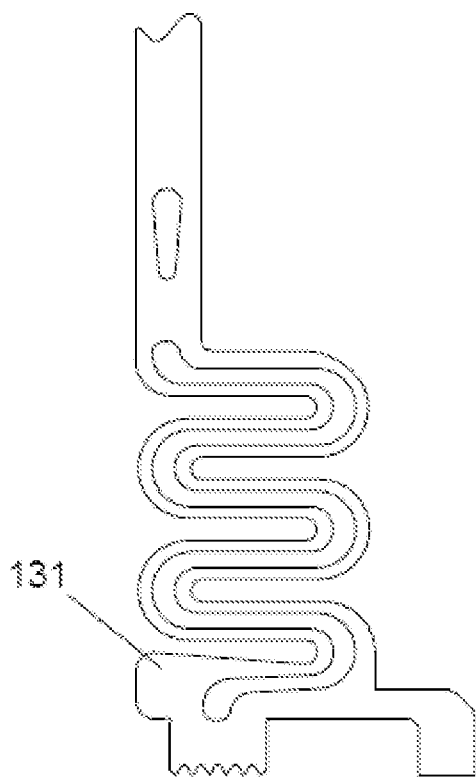
FIG. 2 is a schematic diagram of the structure of an electrical connector provided in embodiment 2 of the present disclosure.

As shown in FIG. 2, embodiment 2 differs from embodiment 1 in that the elastic portion 11 is a hollow structure. Hollow holes extend or are arranged in sections along the extension direction of the elastic portion, resulting in further increasing the elasticity of the elastic portion. The length and position of the hollow hole can be determined according to the need of elasticity, which is not limited herein.

In addition, in order to ensure the structural strength of the electrical connector, a reinforcement portion 131 may be provided at the second extension portion. In other embodiments, a reinforcement portion may also be provided at the first extension portion.

Embodiment 3

Figure 3:
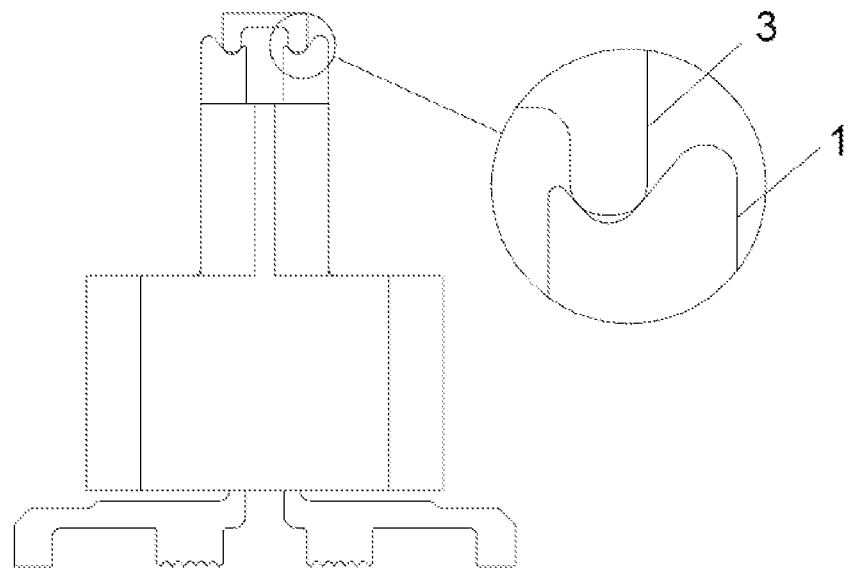
FIGS. 3 and 4 are diagrams of testing states of a device for testing conduction.
Figure 4:
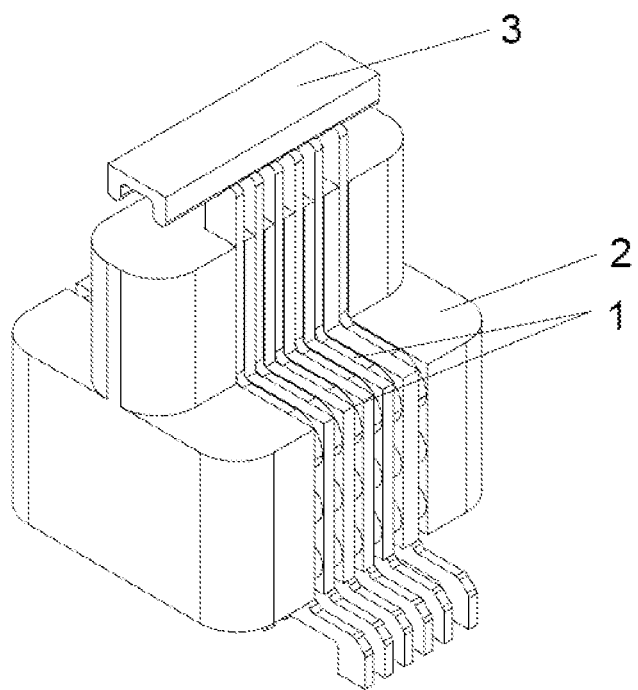
Figure 5:
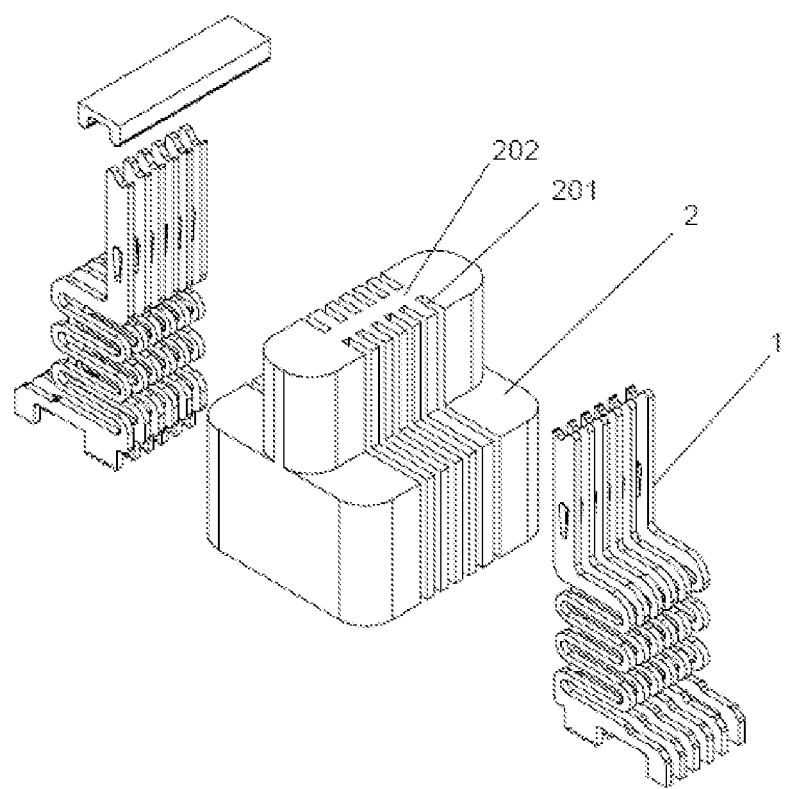
FIG. 5 is an exploded view of the device for testing conduction.

As shown in FIGS. 3-5, the present disclosure also discloses a device for testing conduction which includes a core assembly 2 and the above-mentioned electrical connector 1. The core assembly 2 is provided with at least one placement groove 201 for accommodating the electrical connector. The placement groove 201 matches the shape of the electrical connector 1. Electrical connectors 1 are sequentially distributed and fixed in the corresponding placement grooves respectively. The electrical connectors are symmetrically arranged in two groups, and the two groups of electrical connectors are spaced apart by a spacer 202. The groove structure of the electrical connector is arranged on a side close to the spacer, ensuring effective contact with the product to be tested and the structural strength of the spacer, to improve the service life of the product.

To sum up, the present disclosure provides an electrical connector and a device for testing conduction. By providing the first contact end having a planar structure, the contact area between the electrical connector and the testing substrate is increased, and a large current thus can be conducted and damage to the product and device is avoided. The second contact end is a point or linear structure, and when poor contact is caused due to the uneven testing substrate or oxidization of the testing substrate, the top of the toothed structure can break an oxidization layer to contact the surface of the testing substrate, ensuring effective contact and electrical connection between at least one tooth and the testing substrate, to improve the effectiveness of the electrical connection.

By providing the groove structure at the end of the electrical connector which is in contact with the product to be tested, during the electrical connection, the connection end of the product to be tested is accommodated in the groove structure, resulting in increasing the contact area and achieving a stable and effective connection between the product to be tested and the electrical connector. During the connection, the product to be tested is placed inside the groove structure and then clamped above the bottom of the groove structure, and the product is tangent to the groove structure at left and right groove walls to form two contact lines. The design can ensure that, during the test, the contact positions between products to be tested and the electrical connector are consistent, to ensure the accuracy of the testing structure and avoiding damage to the product.

Moreover, the groove structure extends toward the product to be tested to form the guide structure. When the electrical connection is enabled, the connection end of the product to be tested moves from the guide structure to one side of the groove structure and slides into the groove structure. In the case of a deviation in positioning the product to be tested, the connection end of the product to be tested can be effectively aligned, to ensure the stability and accuracy of the connection and improving the test precision.

What is claimed is:

1. An electrical connector comprising a connection body, a first connection portion at a first end of the connection body and a second connection portion at a second end of the connection body, wherein the first connection portion, the connection body and the second connection portion are molded integrally and wherein the second connection portion is connected to a testing substrate and comprises a first contact end and a second contact end, wherein the first contact end is a planar structure and the second contact end is a point or linear structure, and during an electrical connection, both the first contact end and the second contact end are conducted with the testing substrate, wherein the first connection portion is connected to a product to be tested and an end of the first connection portion facing the product to be tested is provided with a groove structure, wherein a connection end of the product to be tested is accommodated in the groove structure and the groove structure extends toward the product to be tested to form a guide structure, and when the electrical connection is enabled, the connection end of the product to be tested moves from the guide structure to one side of the groove structure and slides into the groove structure.

2. The electrical connector according to claim 1, wherein the second contact end is a toothed structure and the top of the toothed structure is in contact and conducted with the testing substrate.

3. A device for testing conduction comprising a core assembly and the electrical connector according to claim 1, wherein the core assembly is provided with at least one placement groove for accommodating the electrical connector and the placement groove matches the shape of the electrical connector.

4. The electrical connector according to claim 1, wherein the groove structure is arc-shaped and the inner wall of the groove structure is in contact with the connection end, and wherein a connection between the groove structure and the guide structure presents a smooth transition.

5. The electrical connector according to claim 4, wherein when the electrical connection is enabled, the size of the bottom of the groove structure is less than the size of the connection end and the connection end is tangent to the inner wall of the groove structure to form two contact lines.

6. The electrical connector according to claim 1, wherein the connection body comprises an elastic portion, a first extension portion extending upward from the elastic portion and connected to the first connection portion and a second extension portion extending downward from the elastic portion and connected to the second connection portion, and the width of each of the first extension portion and the second extension portion is greater than the width of the elastic portion.

7. The electrical connector according to claim 6, wherein the elastic portion is an S-shaped structure formed by at least one U-shaped member or C-shaped member in form of end-to-end connection, and under an action of an external force, an open end of the U-shaped member or C-shaped member contracts.

8. The electrical connector according to claim 6, wherein the elastic portion is a solid or hollow structure, and when the elastic portion is a hollow structure, hollow holes extend or are arranged in sections along the extension direction of the elastic portion.

9. The electrical connector according to claim 6, wherein the first contact end, the second contact end and the second extension portion are connected to form an inverted U-shaped structure.

* * * * *